United States Patent
Ballagh et al.

(10) Patent No.: US 7,328,421 B1
(45) Date of Patent: Feb. 5, 2008

(54) RELOCATING BLOCKS FOR NETLIST GENERATION OF AN ELECTRONIC SYSTEM

(75) Inventors: Jonathan B. Ballagh, Longmont, CO (US); Roger B. Milne, Boulder, CO (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 429 days.

(21) Appl. No.: 11/059,965

(22) Filed: Feb. 17, 2005

(51) Int. Cl.
*G06F 17/50* (2006.01)
(52) U.S. Cl. .......................... 716/12; 716/11; 716/16
(58) Field of Classification Search ................ 716/1–3, 716/8–18
See application file for complete search history.

(56) References Cited

U.S. PATENT DOCUMENTS

| | | | |
|---|---|---|---|
| 6,609,232 B2 * | 8/2003 | Hirotsu et al. ............. 716/6 |
| 6,722,729 B2 * | 4/2004 | Yoshida et al. ........ 296/187.09 |
| 6,836,877 B1 * | 12/2004 | Dupenloup .................. 716/18 |
| 7,146,853 B2 * | 12/2006 | Fischer et al. ................ 73/146 |
| 7,207,015 B1 * | 4/2007 | Ballagh et al. ................ 716/3 |

* cited by examiner

*Primary Examiner*—Thuan Do
*Assistant Examiner*—Nghia M. Doan
(74) *Attorney, Agent, or Firm*—LeRoy D. Maunu

(57) ABSTRACT

The generation of a netlist for an electronic system includes identifying one or more relocation blocks in a first system design hierarchy for the electronic system and determining a corresponding target block in the first system design hierarchy for each relocation block. The generation of the netlist further includes producing a second system design hierarchy from the first system design hierarchy by relocating each relocation block to the corresponding target block while maintaining connectivity for the one or more ports for each relocation block. The netlist is generated from the second system design hierarchy.

19 Claims, 5 Drawing Sheets

RELOCATING BLOCKS FOR NETLIST GENERATION OF AN ELECTRONIC SYSTEM

FIELD OF THE INVENTION

The present invention generally relates to generating a netlist for an electronic system.

BACKGROUND

Many software tools allow electronic designs to be assembled, simulated, debugged, and translated into hardware. In particular this can be done in a high level abstract environment known as a high level modeling system (HLMS), such as the System Generator HLMS from Xilinx, Inc. of San Jose, Calif. In an HLMS the focus is on automation and convenience. Testing, debugging, and hardware generation are done inside the tool. Signal types are flexible (e.g., signed/unsigned fixed precision real/complex numbers, elements of finite fields, etc.), and adjust automatically to accommodate changes in the design. Details of implementation are only presented implicitly. Blocks are polymorphic and translate automatically into efficient hardware implementations. Bit and cycle-true simulation results in the HLMS guarantee that what is seen at the head of the stream faithfully reflects what is seen in hardware.

A design in an HLMS is usually organized as a collection of objects called "blocks." A block may contain other blocks, in which case the contained blocks are known as "subblocks" or "children" of the container block. The container block is the "parent" of its subblocks. No block may be a subblock of more than one block. A block that has no subblocks is a "leaf," and blocks that have subblocks are "nonleaves." Ordinarily, exactly one block is not a subblock of a larger block. This block is known as the "roof" or the "top level" of the design. Blocks represent electronic objects that consume and transform values produced by other blocks, and produce values to be consumed and transformed by other blocks. Lines of communication between blocks are referred to as "signals." The connection point between a signal and a block is called a "port."

The portion of an HLMS that translates a design into hardware is called the "netlister", and the translation process is known as "netlisting." Usually, the result the netlister produces is expressed in a hardware description language (HDL) such as VHDL or Verilog. VHDL designs are built from objects called "entities." Similarly, Verilog designs are built from "modules". For simplicity, such objects are referred to in this document as entities regardless of the specific HDL.

Entities are in many ways similar to HLMS blocks. In particular, entities can, in effect, be built from smaller entities in much the same way that blocks can be built from subblocks. The most straightforward way to netlist an HLMS design is to produce entities whose organization directly mirrors that of the blocks in the design. To do this, the netlister translates "rank-0" blocks into entities, then rank-1, rank-2, and so on. The "rank" of a leaf block is defined to be rank-0, and the rank of a nonleaf is 1+r, where r represents the maximum rank of the block's subblocks.

For many applications this straightforward approach is adequate. There are, however, circumstances when it is desirable to produce HDL whose organization does not exactly mirror that of the HLMS design from which was derived, and/or to adjust the order in which entities are generated for certain blocks.

The present invention may address one or more of the above issues.

SUMMARY OF THE INVENTION

The generation of a netlist for an electronic system includes identifying one or more relocation blocks in a first system design hierarchy for the electronic system and determining a corresponding target block in the first system design hierarchy for each relocation block. The generation of the netlist further includes producing a second system design hierarchy from the first system design hierarchy by relocating each relocation block to the corresponding target block while maintaining connectivity for the one or more ports for each relocation block. The netlist is generated from the second system design hierarchy.

In another embodiment, an apparatus is provided generating a netlist. The apparatus includes means for identifying relocation blocks, means for determining target blocks, and means for producing a second system design hierarchy from the first system design hierarchy and identified relocation blocks.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In various embodiments of the invention, a block hierarchy for an electronic design is modified by relocating certain blocks to target blocks while maintaining connectivity for the ports of those certain blocks. The modified hierarchy after relocating blocks is functionally identical to the original hierarchy.

When a netlist generation tool processes the modified hierarchy, it produces an HDL realization having a structure that mirrors that of the modified hierarchy. Such adjustments in the resulting HDL structure may be required to meet downstream processing needs. Moreover, by modifying the system hierarchy, certain netlisting tasks can be deferred. This may make some netlisting tasks practical, and simplify others.

In one example, the environment in which the hardware design will run may dictate the organization of the HDL specification. This organization may differ from the organization that corresponds to the block structure of the design. For example, so-called "external memory" blocks in System Generator-based designs appear as subblocks in the HLMS, but cannot be used inside entities produced by the System Generator commercial software product available from Xilinx, Inc. of San Jose, Calif.

In another example, during netlist generation certain blocks may need the generation of the corresponding entity to be delayed beyond the point at which the entity would ordinarily be generated. For example, a design may contain a block with a corresponding entity that uses the balance of hardware resources that are otherwise not needed by the remainder of the design. Such a block cannot be translated until the hardware requirements for the rest of the design are known.

In yet another example, certain blocks can only be realized in hardware when combined with other blocks. For example, System Generator makes "half-memory" blocks available in the HLMS. Half memories come in pairs; when a design contains one half memory, it must also contain a companion half. In hardware, a single half-memory cannot be realized. Instead, the two halves must be combined into a single entity that implements an ordinary full memory.

Figure 1:
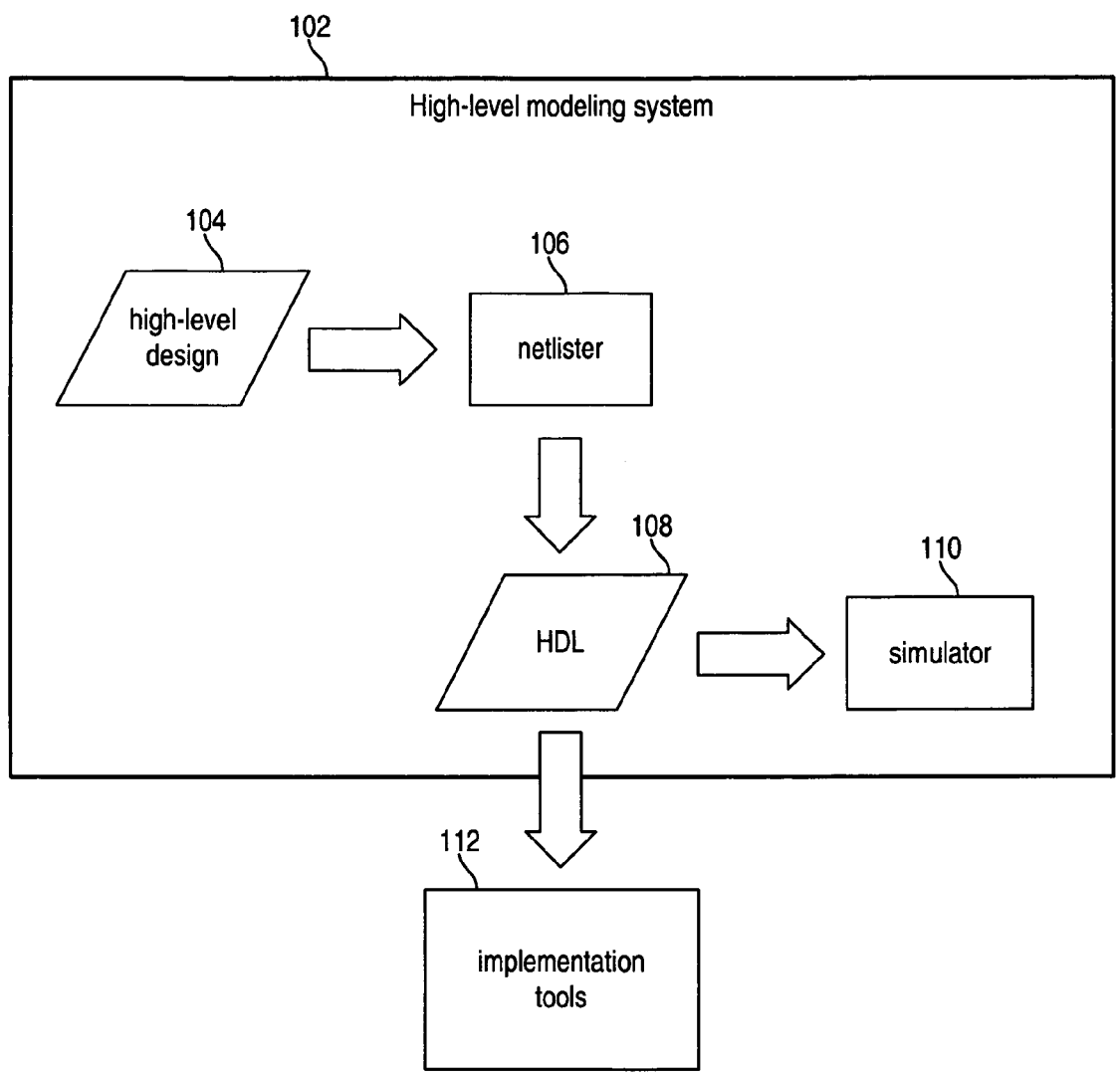
FIG. 1 is a block diagram of an example system in a high level modeling system, according to various embodiments of the invention.

FIG. 1 is a block diagram of a high-level modeling system (HLMS). In addition to supporting the assembly of a high-level design 104, an HLMS may also provide netlisting and simulation tools. The netlister 106 generates hardware description language (HDL) code 108 from the high-level design. The HDL code may be used in simulating the design with simulator 110.

The HDL code may be further processed by other implementation tools 112 such as synthesis compilers, design browsers, hardware mapping, and placement and routing tools. It will be appreciated that the HLMS and design information may be hosted on any of a variety of computing arrangements and architectures.

In various embodiments, the block hierarchy of an electronic design is modified to enable netlist generation by netlister 106 while preserving the functionality of the electronic design. The block hierarchy may need to be modified in order to maintain compatibility of the design with the downstream implementation tools or with the hardware environment in which the design will function. In modifying the block hierarchy, however, the modifications are not made visible at the high-level design as may be viewed by an HLMS user. This allows the user continue to view the design as the same hierarchy that the user created. Underlying data structures or HDL code may be changed to record the modified hierarchy.

An example block to be relocated is a black box of a design. A black box may contain circuits that are specially processed during netlist generation 106 by particular implementation tools 112 that may be selectable by a user. The black box may contain previously developed circuitry that has already been synthesized and mapped to particular hardware resources. An HLMS allows the user to locate a block box at any level in the block hierarchy. However, the implementation tools 112 may require that the black box be located within the top-level block of the design. Thus, the block representing the black box may need to be relocated. Block relocation may be an initial processing step of the netlister 106.

Figure 2A:
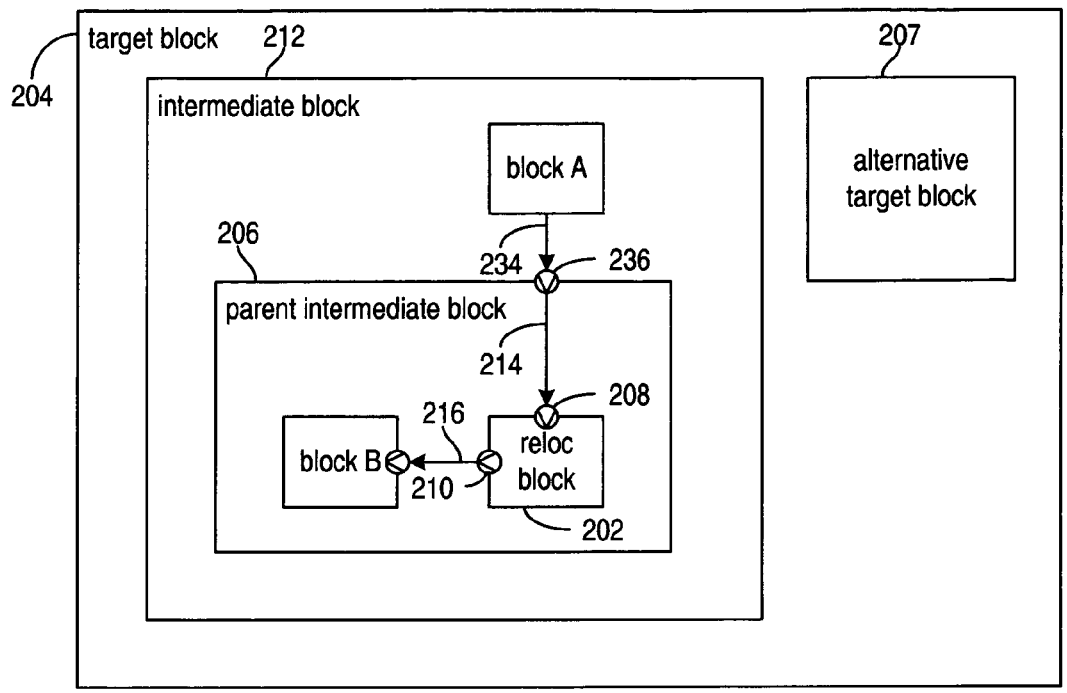
FIG. 2A and FIG. 2B are block diagrams of an example block hierarchy for an electronic system illustrating relocation of a block, according to various embodiments of the invention.
Figure 2B:
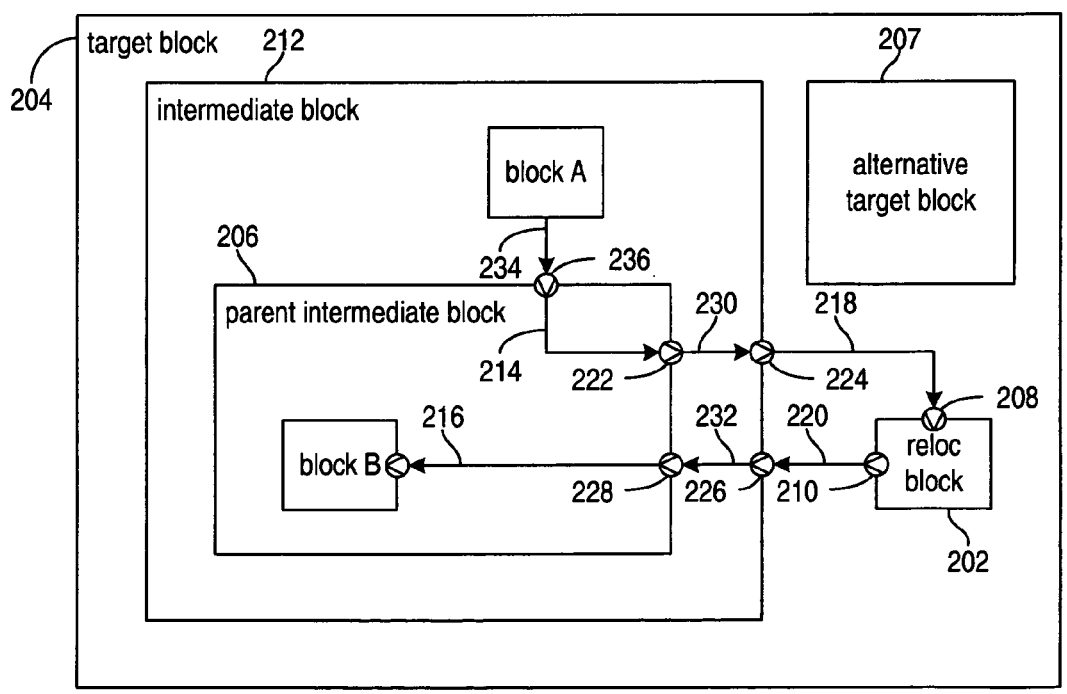

FIG. 2A and FIG. 2B are block diagrams of an example block hierarchy for an electronic system illustrating relocation of a block 202, according to various embodiments of the invention. In various embodiments, the block hierarchy of an electronic system is modified to enable netlist generation while preserving the functionality of the electronic system. FIG. 2A shows an example block hierarchy before modification, and FIG. 2B shows a corresponding block hierarchy after modification. FIG. 2A may correspond to a view presented on a display device to a user of an HLMS; however, FIG. 2B generally does not correspond to a presented view. FIG. 2B may represent the structure of the target block 204 in a generated netlist.

Relocation block 202 has been identified as a block requiring relocation into target block 204. Before modification, relocation block 202 is contained in parent block 206 as shown in FIG. 2A. After modification, relocation block 202 is removed from parent block 206 and added to target block 204 as shown in FIG. 2B. Often, a target block is an ancestor of the relocation block prior to modification, as shown for target block 204 and relocation block 202 in FIG. 2A. However, the target block may by any block in the design hierarchy, such as block 207.

To preserve system functionality, the connections to the ports 208 and 210 of the relocation block 202 generally require modification to maintain connectivity. The blocks in the system hierarchy between the relocation block 202 and the target block 204 before modification are the intermediate blocks 206 and 212. When the target block is an ancestor of the relocation block, the intermediate blocks include the blocks in the design hierarchy between the target block and the relocation block (not including the target block and the relocation block). When the target block is not an ancestor of the relocation block, the intermediate blocks additionally include the target block, and all blocks in the hierarchy that are ancestors of the target block but are not ancestors of the relocation block. For example, if the target block for relocation block 202 is block 207, the intermediate blocks include the blocks 206, 212, and 207. Typically, a target block and the intermediate blocks are modified to maintain connectivity.

The signal on line 214, which connects to the input port 208 of relocation block 202 before modification as shown in FIG. 2A, may not exist in target block 204. Thus, target block 204 is modified to add a signal on line 218 that is connected to input port 208 of relocation block 202 and corresponds to the signal on line 214 as shown in FIG. 2B. Similarly, target block 204 is modified to add a signal on line 220 that is connected to output port 210 of relocation block 202 and corresponds to the signal on line 216 as shown in FIG. 2B. Typically, a target block is modified by adding a relocation block and ports and signals corresponding to the ports of the relocation block. Generally, the ports of a relocation block are not modified.

During modification, ports 222, 224, 226, and 228 are added to the intermediate blocks 206 and 212 and signals on lines 230 and 232 are added to the non-parent intermediate block 212 as shown in FIG. 2B. The signal on line 214 that connects to input port 208 of relocation block 202 before modification as shown in FIG. 2A is similarly connected to the input port 208 of relocation block 202 after modification as shown in FIG. 2B via output port 222 of intermediate block 206, the signal on line 230 of intermediate block 212, output port 224 of intermediate block 212 and the signal on line 218 of target block 204. Similarly, the output port 210 of relocation block 202 is connected to the signal on line 216 after modification as shown in FIG. 2B via the signal on line 220 of target block 204, the input port 226 of intermediate block 212, the signal on line 232 of intermediate block 212, and the input port 228 of intermediate block 206.

Typically, ports corresponding to each port of the relocation block are added to each intermediate block, and signals corresponding to each port of the relocation block are added to the target block and each intermediate block excepting the parent block, before relocation, of the relocation block. Generally, signals corresponding to each port of the relocation block are not added to the parent block, before relocation, of the relocation block because these signals already exist in this parent block.

The ports 222, 224, 226, and 228 corresponding to each port 208 and 210 of the relocation block 202 that are added to each intermediate block 206 and 212 have a corresponding port direction to the corresponding port 208 and 210. For example, port 208 of relocation block 202 is an input port and corresponding ports 222 and 224 are output ports for their respective intermediate blocks 206 and 212. When a port is added to an intermediate block as a consequence of relocation, the direction of the added port depends on the direction of the corresponding port on the relocation block. Sometimes the directions of the two ports are identical; other times they are opposite. In every case, the direction of the added port is chosen to preserve the functionality of the original design. For example, when the target block is an ancestor of the relocation block, the ports added to an intermediate block corresponding to input ports of the relocation block are output ports and the ports added to an intermediate block corresponding to output ports of the relocation block are input ports. It will be appreciated that input/output ports combine the function of an input port and an output port, such that ports added to an intermediate block corresponding to input/output ports of the relocation block are input/output ports.

In another embodiment, certain ports for the intermediate blocks do not need to be added and certain signals for the target block and the non-parent intermediate blocks do not need to be added. For example, because the signal on line 234 exists in intermediate block 212 before modification as shown in FIG. 2A, the signal on line 230 does not need to be added to intermediate block 212 and port 222 does not need to be added to intermediate block 206. Instead, the signal on line 234 may be directly connected to port 224 of intermediate block 212. The port 236 and signal on line 214 of block 206 may additionally need to be eliminated during modification if the only destination in block 206 for the signal on line 214 before modification is the relocation block 202.

It will be appreciated that because the signals on lines 234 and 230 both exist within intermediate block 212 after modification as shown in FIG. 2B, distinct signal naming may be required for the signals on lines 234 and 230 for certain design tools, such as an HLMS, even though these two signals on lines 234 and 230 may be functionally identical. It will be appreciated that target block 204 is not necessarily the top-level block for the electronic system.

Figure 3A:
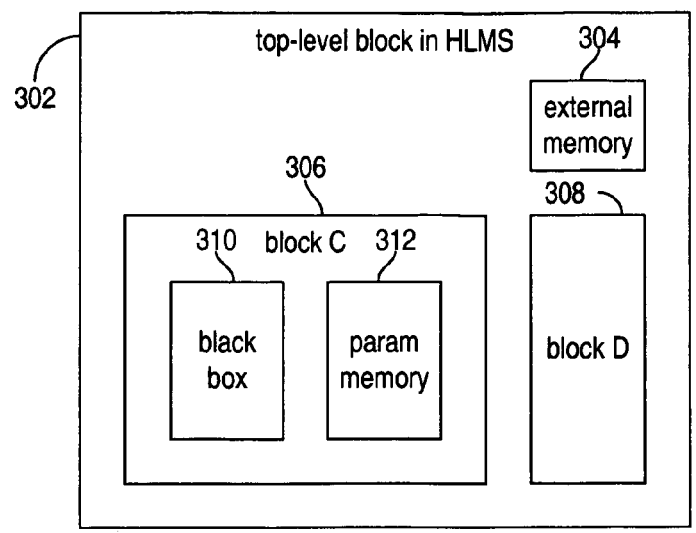
FIG. 3A and FIG. 3B are block diagrams of an example illustrating relocation of blocks into or outside of the top level block, according to various embodiments of the invention.
Figure 3B:
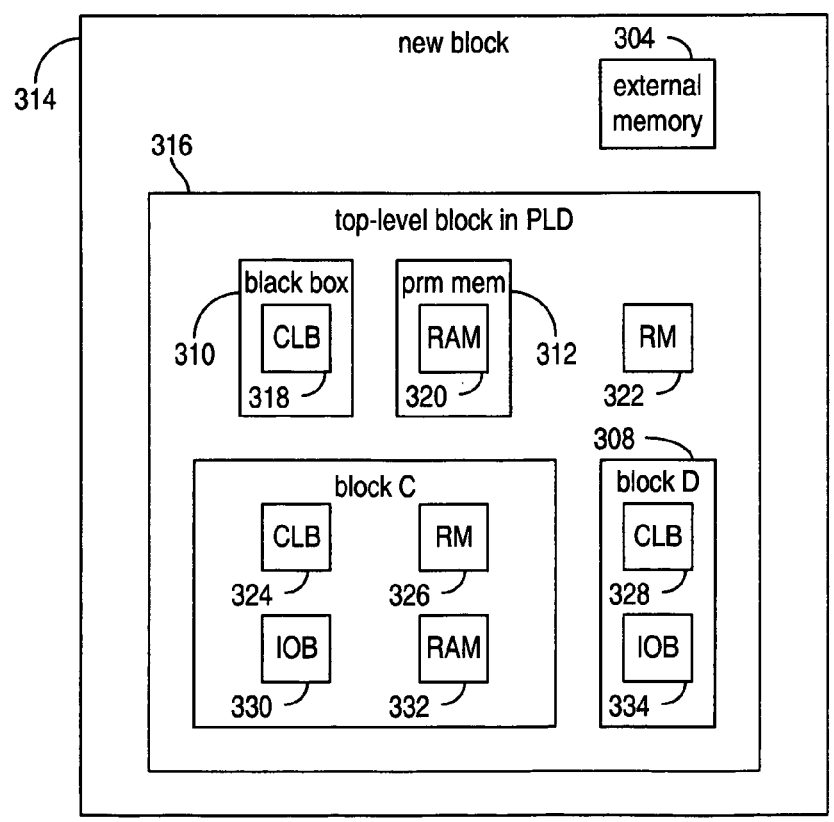

FIG. 3A and FIG. 3B are block diagrams of an example illustrating relocation of blocks into or outside of the top level block, according to various embodiments of the invention. FIG. 3A shows a block hierarchy for an electronic system before modification and FIG. 3B shows the corresponding block hierarchy for the electronic system after modification. Further, FIG. 3A shows the block hierarchy in an HLMS while FIG. 3B shows the corresponding modified block hierarchy in a hardware implementation after generation of a netlist. The modified block hierarchy may be preserved in the hardware implementation (and not flattened), allowing the structure of the electronic system to be analyzed in the hardware implementation.

The top-level block 302 in the HLMS includes an external memory 304, block C (306), and block D (308) as shown in FIG. 3A. In addition, Block C (306) includes a black box 310 and a parameterized memory 312.

The hardware implementation 314 for the electronic system shown in FIG. 3B may be a printed circuit board including external memory 304 and programmable Logic Device (PLD) 316. During netlist generation, the various blocks 302, 304, 306, 308, 310, and 312 in the HLMS are mapped to resources on the hardware implementation 314. The PLD 316 includes resources including configurable logic blocks (CLB) 318, 324, and 328, RAM 320 and 332, routing matrices (RM) 322 and 326, and input/output blocks (IOB) 330 and 334. The external memory 304 in the HLMS 302 is mapped to the external memory 304 resource in the hardware implementation 314 and the remaining blocks 302, 306, 308, 310, and 312 are mapped to resources 318 through 334 of PLD 316, with certain PLD 316 resources potentially unused, such as RM 322. One example of a PLD is a field programmable gate array (FPGA).

Typically, the top-level block 302 of the HLMS of FIG. 3A is mapped to the PLD 316 of FIG. 3B. For convenience in developing the electronic system in the HLMS, the external memory 304 is inside the top-level block 302 in the HLMS, but the external memory 304 is outside the top-level block 316 in the hardware implementation 314. Thus, to match the physical requirements of the hardware implementation 314, the external memory 304 of HLMS 302 is relocated outside the existing top-level block 302 during netlist generation. The external memory 304 of HLMS 302 is a relocation block and the added block 314 for the hardware implementation is the corresponding target block.

Black box 310 of HLMS 302 may contain circuits that are specially processed during netlist generation by particular netlist generation tools that may be selectable by a user. An example block box 310 of HLMS 302 may contain previously developed circuitry that has already been synthesized and mapped to particular PLD 316 resources, such as CLB 318 as shown in FIG. 3B. For convenience in developing the electronic system in HLMS 302, a block box 310 is allowed to be located anywhere in the system hierarchy for the electronic system, such as within block C 306. To provide special processing for the black box 310, the netlist generation tools may require that the black box 310 be located within the top-level block 302 in the HLMS. Thus, black box 310 is a relocation block and the target block is top-level block 302 in the HLMS with corresponding block 316 in the hardware implementation 314.

Parameterized memory 312 may include parameterized data values at parameterized address locations. Parameters, such as VHDL generics, may be used to specify the values for the data and/or addresses in the parameterized memory 312. Certain tools, such as Xilinx's System Generator for DSP, require that parameterized blocks are located within the top-level block 302. Thus, parameterized memory 312 in block C 306 of HLMS 302 is a relocation block and the target block is top-level block 302 in the HLMS. During netlist generation, the relocated parameterized memory 312 may be mapped to the PLD 316 resource of RAM 320. Block D 308 in the HLMS 302 may be mapped to CLB 328 and IOB 334, and Block C 306, excluding black box 310 and parameterized memory 312, may be mapped to CLB 324, RM 326, 10B 330, and RAM 332 during netlist generation.

Block relocation may be an initial processing step during netlist generation. The original hierarchy may have a description in a HDL and relocation may modify the HDL or a data structure representing the HDL by moving the instantiation of the relocation block from the parent block in the original hierarchy to the target block. The relocation may occur seamlessly during netlist generation, allowing the user of the HLMS to freely instantiate blocks that may require relocation anywhere in the system hierarchy.

Figure 4A:
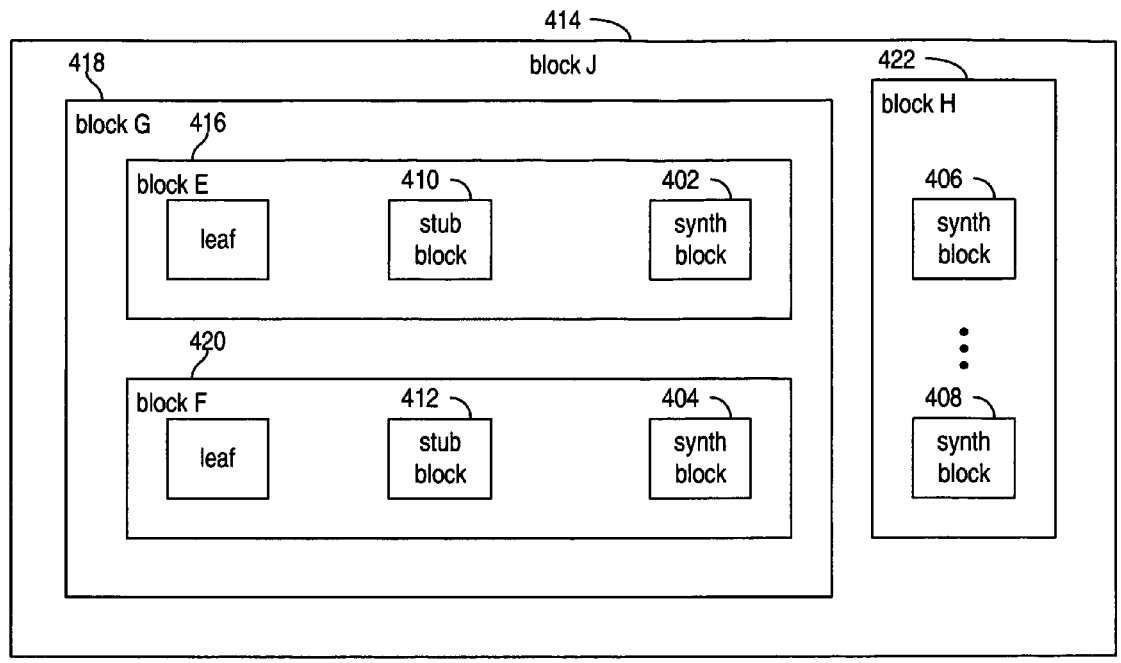
FIG. 4A and FIG. 4B are block diagrams of an example illustrating relocation and grouping of blocks in a system hierarchy, according to various embodiments of the invention.
Figure 4B:
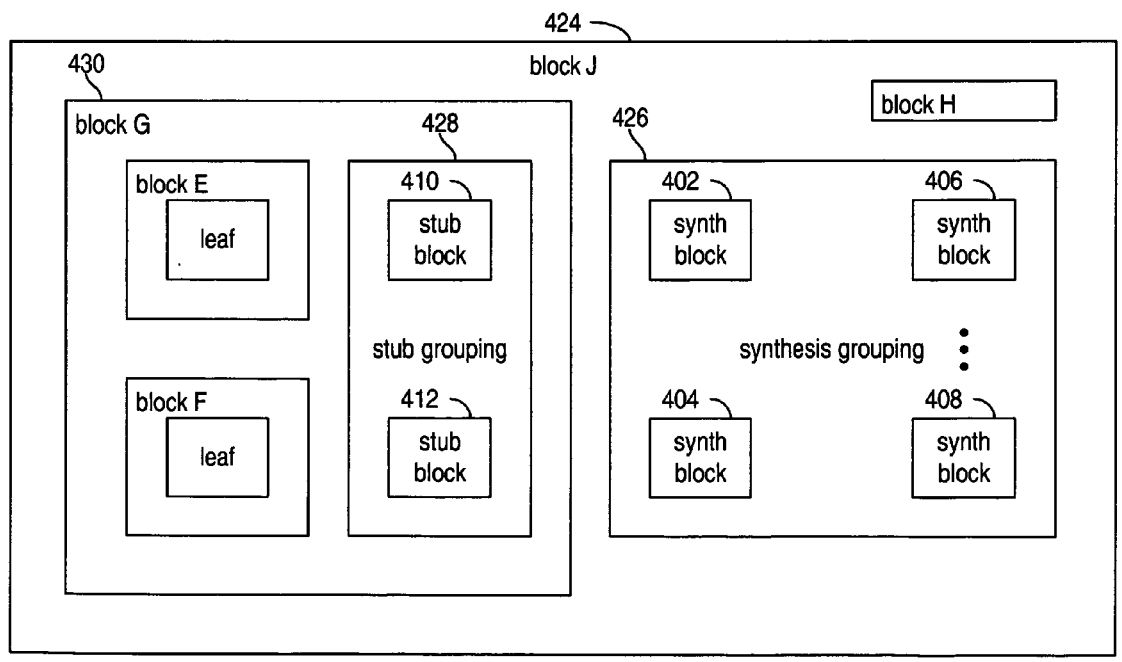

FIG. 4A and FIG. 4B are block diagrams of an example illustrating relocation and grouping of blocks in a system hierarchy, according to various embodiments of the invention. Synthesis blocks 402, 404, 406, 408 and stub blocks 410 and 412 are relocated and grouped. FIG. 4B may correspond to the structure of the modified system hierarchy in a generated netlist.

Black boxes, such as synthesis blocks 402 through 408, may need to be relocated to the top-level block J 414 during netlist generation. Thus, synthesis block 402 is removed from block E 416 and block G 418, synthesis block 404 is removed from block F 420 and block G 418, and synthesis blocks 406 and 408 are removed from block H 422, and each of these synthesis blocks 402, 404, 406, and 408 is relocated to modified block J 424. Subsequently, the relocated synthesis blocks 402, 404, 406, and 408 may be grouped together in a new block 426 for the grouping of synthesis blocks.

Synthesis grouping 426 contains only synthesis blocks 402, 404, 406, and 408 after relocation and grouping. The synthesis grouping 426 may assist the special processing for synthesis blocks during netlist generation. For example, a tool, such as XST from Xilinx, that provides special synthesis processing, may have a high start-up cost for each synthesis block in the top level. By grouping the synthesis blocks 402, 404, 406, and 408 together in synthesis grouping 426, the start-up cost of the synthesis tool may be incurred only once.

Each stub block 410 and 412 may represent a function, such as an interface for a shared memory used for communication between clock domains, which cannot individually be realized in a hardware implementation. The stubs blocks 410 and 412 for a shared memory can be realized in a hardware implementation after the stub blocks 410 and 412 are grouped together in a new block 428. Generally, each stub block of a pair of stub blocks 410 and 412 is relocated to a common ancestor, such as modified block G 430 corresponding to block G 418, and then grouped in a stub grouping block 428.

It will be appreciated that adding a new grouping block 426 or 428 to a system hierarchy generally requires maintaining connectivity by adding appropriate ports and signals to the grouping block 426 or 428. Generally, the ports added to a grouping block match the port direction of the grouped blocks, for example, the port direction for each port (not shown) of synthesis grouping block 426 matches the port direction for a respective port of the relocated synthesis blocks 402, 404, 406, and 408.

Figure 5:
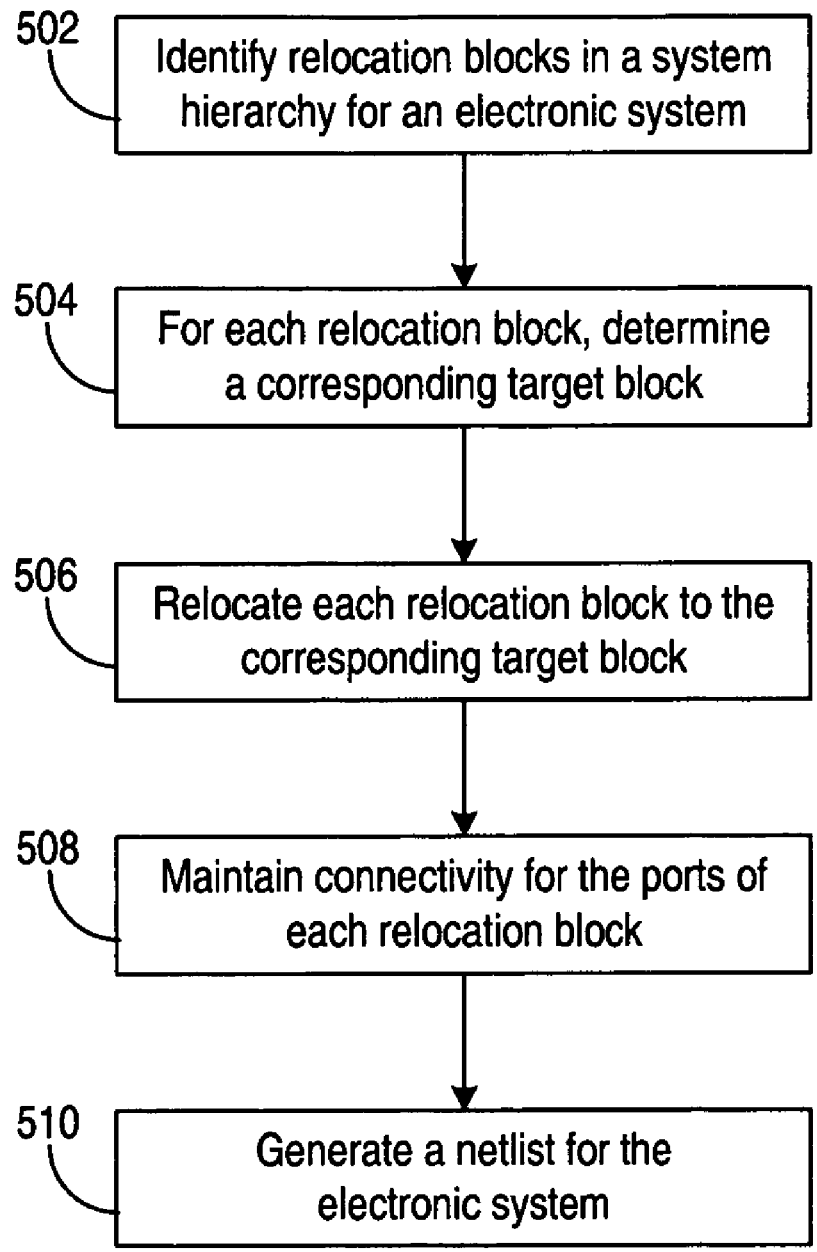
FIG. 5 is a flow diagram of a process for generating a netlist using relocation of blocks, according to various embodiments of the invention.

FIG. 5 is a flow diagram of a process for generating a netlist using relocation of blocks, according to various embodiments of the invention.

At step 502, the blocks to be relocated are identified in the system hierarchy for an electronic system. For example, the blocks needing relocation may be identified by a block type, for example, a black box, a parameterized memory, or an external memory. At step 504, the corresponding target block for each relocation block is determined. For example, the target block may be the top-level block for the electronic system for blocks with a particular type, such as a black box or a parameterized memory, the target block may be a new block added outside of the top-level block for the electronic system for blocks with another particular type, such as an external memory, and the target block may be a shared ancestor block for related relocation blocks with yet another particular type, such as a shared memory stub for communication between two clock domains.

At step 506, the system hierarchy is modified by relocating each relocation block to the corresponding target block, while at step 508, the connectivity for each port of each relocation block is maintained. Generally, connectivity is maintained for a particular relocation block by adding ports and signals corresponding to the ports of the relocation block to certain blocks in the system hierarchy between the relocation block and the corresponding target block. At step 510, a netlist is generated for the electronic system from the modified system hierarchy.

Those skilled in the art will appreciate that various alternative computing arrangements, including one or more processors and a memory arrangement configured with program code, would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for generating a netlist for an electronic system. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for generating a netlist for an electronic system, comprising:
   via a processor executing program code,
   identifying one or more relocation blocks from blocks of a first system design hierarchy for the electronic system, wherein each relocation block has one or more ports;
   wherein each port of each relocation block is defined to be connected to another port of a block from the first system design hierarchy;
   determining a corresponding target block in the first system design hierarchy for each relocation block;
   wherein the corresponding target block for each relocation block is an ancestor of the relocation block in the first system design hierarchy;
   producing a second system design hierarchy from the first system design hierarchy, and in the second system design hierarchy relocating each relocation block to the corresponding target block, and maintaining connectivity for the one or more ports for each relocation block;
   wherein the connectivity maintained for each port of each relocation block is between the port of the relocation block and the another port of a block; and
   generating the netlist from the second system design hierarchy.

2. The method of claim 1, wherein the maintaining connectivity for the one or more ports for each relocation block includes modifying ports for each intermediate block in the first system design hierarchy between the relocation block and the corresponding target block.

3. The method of claim 2, wherein the modifying the ports includes adding a respective extra port corresponding to each of the one or more ports of the relocation block to each intermediate block.

4. The method of claim 3, wherein each intermediate block in the first system design hierarchy is between the relocation block and the corresponding target block, and the respective extra port corresponding to an input port of the relocation block is an output port, the respective extra port corresponding to an output port of the relocation block is an input port, and the respective extra port corresponding to an input/output port of the relocation block is an input/output port.

5. The method of claim 2, wherein the maintaining connectivity for the one or more ports for each relocation block includes modifying signals in the corresponding target block and in each intermediate block other than a parent of the relocation block.

6. The method of claim 5, wherein the modifying the signals includes adding a respective extra signal corresponding to each of the one or more ports of the relocation block in the corresponding target block and in each intermediate block other than the parent.

7. The method of claim 1, wherein identifying the one or more relocation blocks is based on type information associated with each block of the first system design hierarchy.

8. The method of claim 7, wherein the determining the corresponding target block for each relocation block is based on the type information associated with the relocation block.

9. The method of claim 8, wherein producing the second system design hierarchy further includes adding a group block within a target block, relocating to the group block each relocation block determined to correspond to the target block and having type information of a first value, and maintaining connectivity for the one or more ports for each of the relocation blocks.

10. The method of claim 9, wherein the target block is a top-level block of the first system design hierarchy and the first value of type information for at least one of the relocation blocks indicates a synthesis type.

11. The method of claim 9, wherein at least one of the relocation blocks is a pair of stub blocks, the target block is a shared ancestor for the stub blocks, and the first value of type information for each of the stub blocks indicates a stub type.

12. The method of claim 1, wherein the producing the second system design hierarchy further includes adding a new top-level block that contains the first system design hierarchy.

13. The method of claim 12, wherein the target block that corresponds to at least one of the relocation blocks is the new top-level block.

14. The method of claim 13, wherein determining the corresponding target block for each relocation block is based on a type information associated with the relocation block.

15. The method of claim 14, wherein the type information associated with the at least one of the relocation blocks indicates an external memory type.

16. The method of claim 14, wherein the type information associated with the at least one of the relocation blocks indicates a black box type and wherein the generating the netlist includes selecting an approach for generating the netlist for the at least one of the relocation blocks in response to the type information associated with the at least one of the relocation blocks.

17. The method of claim 1, wherein generating the netlist includes serially generating a netlist for each block in an order corresponding to a location of the block in the second system design hierarchy, relocating each relocation block to the corresponding target block includes determining a position for each relocation block in the order, and determining a corresponding target block for each relocation block includes determining the position for at least one relocation block in the order.

18. The method of claim 1, wherein the generating the netlist includes generating configuration data used to program configurable logic and configurable routing of a programmable logic device.

19. An apparatus for generating a netlist for an electronic system, comprising:
 means for identifying one or more relocation blocks from blocks of a first system design hierarchy for the electronic system, wherein each relocation block has one or more ports;
 wherein each port of each relocation block is defined to be connected to another port of a block from the first system design hierarchy;
 means for determining a corresponding target block in the first system design hierarchy for each relocation block;
 wherein the corresponding target block for each relocation block is an ancestor of the relocation block in the first system design hierarchy;
 means for producing a second system design hierarchy from the first system design hierarchy, and in the second system design hierarchy relocating each relocation block to the corresponding target block, and maintaining connectivity for the one or more ports for each relocation block;
 wherein the connectivity maintained for each port of each relocation block is between the port of the relocation block and the another port of a block; and
 means for generating the netlist from the second system design hierarchy.

* * * * *